United States Patent
Liu

(10) Patent No.: US 11,690,175 B2
(45) Date of Patent: Jun. 27, 2023

(54) CONNECTION STRUCTURE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Chang Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 17/331,087

(22) Filed: May 26, 2021

(65) Prior Publication Data

US 2021/0400814 A1 Dec. 23, 2021

(30) Foreign Application Priority Data

Jun. 18, 2020 (CN) .......................... 202010561655.1

(51) Int. Cl.
| | | |
|---|---|---|
| *H05K 1/14* | (2006.01) | |
| *H05K 1/18* | (2006.01) | |
| *H01L 25/18* | (2023.01) | |
| *H05K 1/03* | (2006.01) | |
| *H05K 1/09* | (2006.01) | |

(52) U.S. Cl.
CPC ............. *H05K 1/147* (2013.01); *H01L 25/18* (2013.01); *H05K 1/189* (2013.01); *H05K 1/0346* (2013.01); *H05K 1/09* (2013.01); *H05K 2201/0154* (2013.01); *H05K 2201/049* (2013.01); *H05K 2201/058* (2013.01); *H05K 2201/10128* (2013.01); *H05K 2201/10136* (2013.01)

(58) Field of Classification Search
CPC ...... H05K 1/147; H05K 1/189; H05K 1/0346; H05K 1/09; H05K 1/142; H05K 1/144; H05K 1/145; H05K 1/14; H05K 2201/0154; H05K 2201/049; H05K 2201/058; H05K 2201/10128; H05K 2201/10136; H05K 2201/042; H05K 2201/043; H05K 2201/046; H01L 23/5387; H01L 25/18; H01R 12/61; G09F 9/00
See application file for complete search history.

(56) References Cited

U.S. PATENT DOCUMENTS

| | | | |
|---|---|---|---|
| 10,492,294 B2 * | 11/2019 | Fukuda | ................ H05K 1/0281 |
| 2009/0289885 A1 * | 11/2009 | Chao | ...................... H05K 1/147 345/98 |
| 2020/0258971 A1 * | 8/2020 | Oh | ..................... G02F 1/136286 |
| 2020/0267842 A1 * | 8/2020 | Park | ....................... H05K 1/147 |

\* cited by examiner

*Primary Examiner* — Roshn K Varghese
(74) *Attorney, Agent, or Firm* — Dority & Manning, P.A.

(57) ABSTRACT

A connection structure configured to connect a display panel and a circuit board, includes a flexible printed circuit, a first chip-on-film, and a second chip-on-film. The first chip-on-film and the second chip-on-film are coupled to one end of the flexible printed circuit. The first chip-on-film and the second chip-on-film are coupled to two surfaces of the flexible printed circuit that are opposite in a thickness direction of the flexible printed circuit.

19 Claims, 10 Drawing Sheets

CONNECTION STRUCTURE AND DISPLAY DEVICE

CROSS-REFERENCE TO RELATED APPLICATIONS

This application claims priority to Chinese Patent Applications No. 202010561655.1, filed on Jun. 18, 2020, which is incorporated herein by reference in its entirety.

TECHNICAL FIELD

The present disclosure relates to the field of display technologies, and in particular, to a connection structure and a display device.

BACKGROUND

In order to meet the increasing visual demands of consumers, display products are developed toward high resolution or large size.

SUMMARY

In one aspect, a connection structure is provided. The connection structure is configured to connect a display panel and a circuit board. The connection structure includes a flexible printed circuit, a first chip-on-film, and a second chip-on-film. The first chip-on-film and the second chip-on-film are coupled to one end of the flexible printed circuit. The first chip-on-film and the second chip-on-film are coupled to two surfaces of the flexible printed circuit that are opposite in a thickness direction of the flexible printed circuit.

In some embodiments, the first chip-on-film includes a first portion disposed on and in direct contact with the flexible printed circuit, and the second chip-on-film includes a second portion disposed on and in direct contact with the flexible printed circuit. An orthogonal projection of the first portion on a plane perpendicular to the thickness direction of the flexible printed circuit and an orthogonal projection of the second portion on the plane at least partially overlap.

In some embodiments, the orthogonal projection of the first portion on the plane approximately completely overlaps with the orthogonal projection of the second portion on the plane.

In some embodiments, shapes of the first portion and the second portion are both rectangular.

In some embodiments, the first chip-on-film further includes a third portion and a fourth portion, the third portion is located between the first portion and the fourth portion, and the fourth portion is configured to be coupled with the display panel. The second chip-on-film includes a fifth portion and a sixth portion, the fifth portion is located between the second portion and the sixth portion, and the sixth portion is configured to be coupled with the display panel. An orthogonal projection of the third portion on the plane and an orthogonal projection of the fifth portion on the plane at least partially overlap.

In some embodiments, an included angle between a direction in which the third portion is inclined and a direction in which the fifth portion is inclined is greater than 0° and less than or equal to 90°.

In some embodiments, the third portion is in a shape of an approximate parallelogram; and/or the fifth portion is in a shape of an approximate parallelogram.

In some embodiments, a side of an orthogonal projection of the fourth portion on the plane and an adjacent side of an orthogonal projection of the sixth portion on the plane have a distance therebetween.

In some embodiments, shapes of the fourth portion and the sixth portion are both rectangular.

In some embodiments, the first chip-on-film includes a first flexible substrate and at least one first chip disposed on the first flexible substrate; the second chip-on-film includes a second flexible substrate and at least one second chip disposed on the second flexible substrate. An orthogonal projection of the at least one first chip on a plane perpendicular to the thickness direction of the flexible printed circuit is non-overlapping with an orthogonal projection of the at least one second chip on the plane.

In some embodiments, the first flexible substrate and the second flexible substrate both include a flexible base, a wiring layer disposed on the flexible base, and an insulating layer disposed on a side of the wiring layer away from the flexible base. The wiring layer includes a plurality of traces, and two ends of each trace are a first pin and a second pin; the first pin and the second pin are configured to be bonded to the flexible printed circuit and the display panel, respectively.

In some embodiments, in the first chip-on-film, an orthogonal projection of the insulating layer on the flexible base is non-overlapping with orthogonal projections of first pins and second pins of the plurality of traces and the at least one first chip on the flexible base. In the second chip-on-film, an orthogonal projection of the insulating layer on the flexible base is non-overlapping with orthogonal projections of first pins and second pins of the plurality of traces and the at least one second chip on the flexible base.

In some embodiments, the wiring layer is made of silver or copper; and/or, the insulating layer is made of green oil.

In another aspect, a display device is provided. The display device includes a display panel, the connection structure according to any of the embodiments described above. The display panel includes a base substrate and a plurality of bonding elements disposed on the base substrate. The first chip-on-film and the second chip-on-film of the connection structure are bonded to the plurality of bonding elements.

In some embodiments, the first chip-on-film includes a first portion disposed on and in direct contact with the flexible printed circuit, and the second chip-on-film includes a second portion disposed on and in direct contact with the flexible printed circuit. The first chip-on-film further includes a third portion and a fourth portion, the third portion is located between the first portion and the fourth portion; and the second chip-on-film further includes a fifth portion and a sixth portion, the fifth portion is located between the second portion and the sixth portion. The fourth portion and the sixth portion are bonded to the plurality of bonding elements.

In some embodiments, the plurality of bonding elements include a plurality of first bonding elements and a plurality of second bonding elements. The first chip-on-film is bonded to the plurality of first bonding elements. The second chip-on-film is bonded to the plurality of second bonding elements. The plurality of first bonding elements and the plurality of second bonding elements are located on a same surface of the base substrate, and two adjacent side faces of two adjacent bonding elements among the plurality of first bonding elements and the plurality of second bonding elements have a distance therebetween.

In some other embodiments, the plurality of bonding elements include a plurality of first bonding elements and a plurality of second bonding elements. The first chip-on-film is bonded to the plurality of first bonding elements. The second chip-on-film is bonded to the plurality of second bonding elements. The plurality of first bonding elements and the plurality of second bonding elements are respectively located on opposite surfaces of the base substrate in a thickness direction of the base substrate.

In some embodiments, orthogonal projections of the plurality of first bonding elements on a plane perpendicular to the thickness direction of the base substrate overlap with orthogonal projections of the plurality of second bonding elements on the plane.

In some embodiments, orthogonal projections of the plurality of first bonding elements on a plane perpendicular to the thickness direction of the base substrate are non-overlapping with orthogonal projections of the plurality of second bonding elements on the plane.

In some embodiments, the display device further includes a circuit board. The circuit board is bonded to another end of the flexible printed circuit of the connection structure.

BRIEF DESCRIPTION OF THE DRAWINGS

In order to describe technical solutions of the present disclosure more clearly, the accompanying drawings to be used in some embodiments of the present disclosure will be introduced briefly below. However, the accompanying drawings to be described below are merely accompanying drawings of some embodiments of the present disclosure, and those of ordinary skill in the art can obtain other drawings according to those drawings. In addition, the accompanying drawings in the following description can be regarded as schematic diagrams, and are not limitations on actual dimensions of products, actual processes of methods and actual timings of signals involved in the embodiments of the present disclosure.

DETAILED DESCRIPTION

Figure 1:
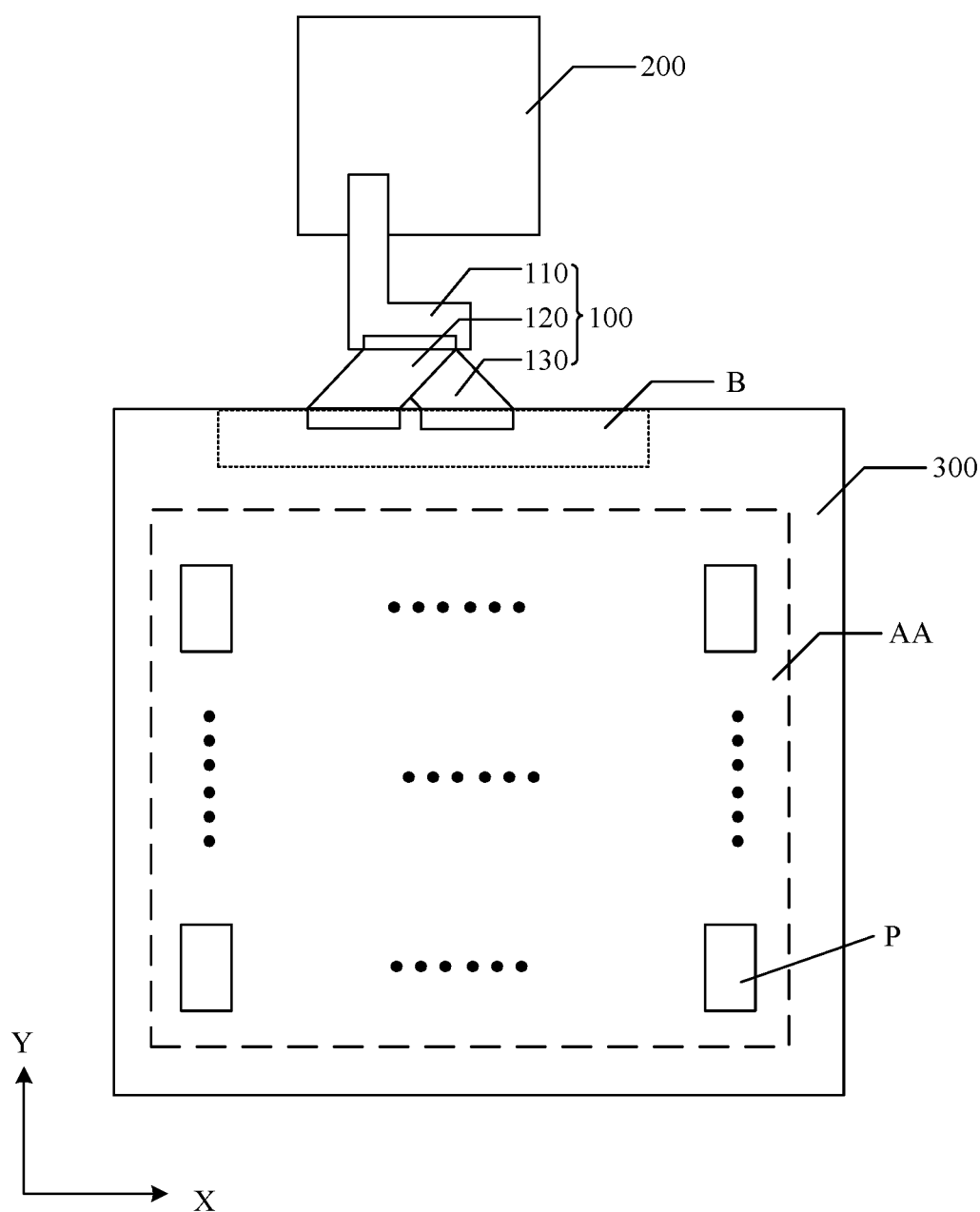
FIG. 1 is a structural diagram of a display device, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art on the basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meaning, i.e., "including, but not limited to." In the description, the terms such as "one embodiment," "some embodiments," "exemplary embodiments," "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined with "first" and "second" may explicitly or implicitly include one or more of the features. In the description of the embodiments of the present disclosure, "a/the plurality of" means two or more unless otherwise specified.

In the description of some embodiments, the terms "coupled" and "connected" and their derivatives may be used. For example, the term "connected" may be used in the description of some embodiments to indicate that two or more components are in direct physical or electric contact with each other. As another example, the term "coupled" may be used in the description of some embodiments to indicate that two or more components are in direct physical or electric contact. However, the term "coupled" or "connected" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

The use of "applicable to" or "configured to" herein is meant as open and inclusive expression, which does not exclude devices that are applicable to or configured to perform additional tasks or steps.

The term "about" or "approximately" as used herein includes a stated value and an average value within an acceptable range of deviation of a particular value. The acceptable range of deviation is determined by a person of ordinary skill in the art in view of measurement in question and errors associated with a particular amount of measurement (i.e., the limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of regions shown herein, but as including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In a display product (e.g., a mobile phone, etc.), a display panel may be connected to a circuit board through a flexible printed circuit (FPC), so that the display panel may receive control signals provided by the circuit board through the flexible printed circuit, and display images according to the control signals. For a display product with high resolution and/or large size, a width of the flexible printed circuit is large due to a large number of signal lines. In this way, the flexible printed circuit may occupy a large space in the display product, so that the display product may not easily achieve compact layout, lightness and thinness.

Some embodiments of the present disclosure provide a display device. For example, the display device may be any device that displays images whether in motion (e.g., video) or stationary (e.g., still images), and regardless of literal or graphical. For example, the display device may be one of a variety of electronic devices, and the described embodiments may be implemented in or associated with the variety of electronic devices such as, but not limit to, mobile telephones, wireless devices, personal digital assistants (PDAs), hand-held or portable computers, global positioning system (GPS) receivers/navigators, cameras, moving picture experts group 4 (MP4) video players, video cameras, game consoles, watches, clocks, calculators, television monitors, flat-panel displays, computer monitors, automobile displays (e.g., odometer displays, etc.), navigators, cockpit controllers and/or displays, displays for camera view (e.g., displays for rear view cameras in vehicles), electronic photographs, electronic billboards or signs, projectors, architectural structures, packaging and aesthetic structures (e.g., displays of images for a piece of jewelry), etc. Embodiments of the present disclosure do not particularly limit a specific form of the display device.

In some embodiments, as shown in FIG. 1, the display device 400 includes a display panel 300. For example, the display panel 300 is a liquid crystal display (LCD) panel, or a self-luminous display panel, such as an organic light-emitting diode (OLED) display panel, a quantum dot light-emitting diode (QLED) display panel, a light-emitting diode (LED) display panel, etc.

As shown in FIG. 1, the display panel 300 has a display area AA. The display panel 300 includes a plurality of sub-pixels P arranged in the display area AA. For example, the plurality of sub-pixels P may be arranged in an array. For example, sub-pixels P arranged in a row along a first direction X are referred to as sub-pixels in a same row, and sub-pixels P arranged in a column along a second direction Y are referred to as sub-pixels in a same column. For example, the first direction X and the second direction Y are perpendicular to each other.

In some embodiments, as shown in FIG. 1, the display device 400 further includes a connection structure 100. The connection structure 100 is coupled to the display panel 300. For example, the display panel 300 further has a bonding region B, and the bonding region B is located at a side of the display area AA. The connection structure 100 is bonded to the display panel 300 in the bonding region B.

In some embodiments, as shown in FIG. 1, the display device 400 further includes a circuit board 200 coupled to the connection structure 100. In some examples, the circuit board 200 may be a host circuit board or a control circuit board of the display device 400, and is configured to provide control signals. In some examples, the circuit board 200 is a printed circuit board assembly (PCBA), which includes a printed circuit board (PCB), and a timing controller (TCON), a power management integrated circuit (PMIC), and other integrated circuits (ICs) or circuits that are disposed on the PCB.

The display panel 300 and the circuit board 200 are connected through the connection structure 100. In this case, the circuit board 200 may provide signals (e.g., control signals) to the connection structure 100, the connection structure 100 may transmit the signals to the display panel 300, and the display panel 300 may display an image according to the signals. That is, the connection structure 100 is used to realize indirect connection between the display panel 300 and the circuit board 200, and thereby realize signal transmission between the display panel 300 and the circuit board 200.

Figure 2:
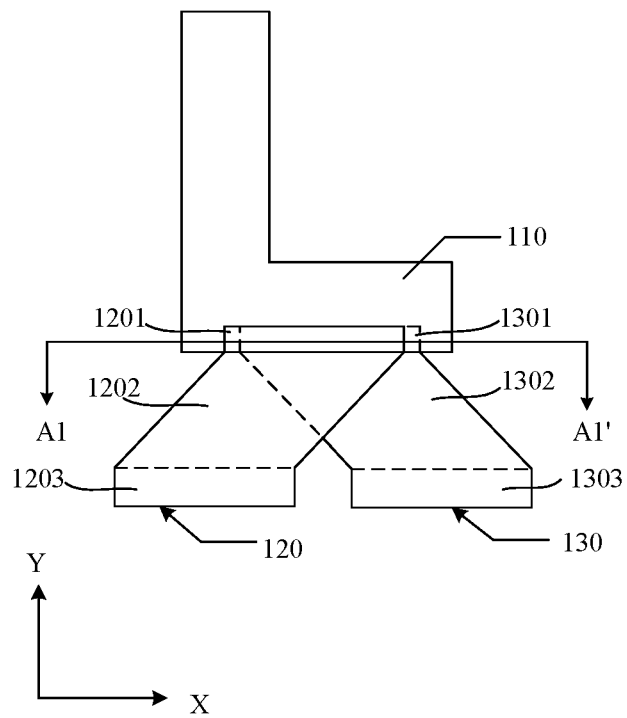
FIG. 2 is a structural diagram of a connection structure, in accordance with some embodiments.
Figure 3:
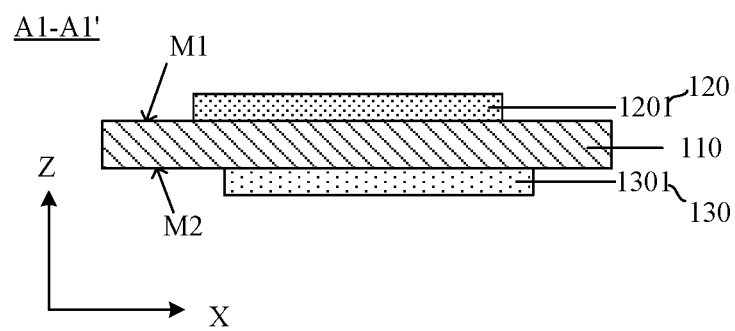
FIG. 3 is a sectional view of the connection structure shown in FIG. 2 taken along the A1-A1' line.

In some embodiments, as shown in FIGS. 1 to 3, the connection structure 100 includes a flexible printed circuit 110, a first chip-on-film 120, and a second chip-on-film 130.

As shown in FIGS. 1 and 2, the first chip-on-film 120 is coupled to one end (referred to as a first end hereinafter) of the flexible printed circuit 110, and the second chip-on-film 130 is also coupled to the first end of the flexible printed circuit 110. In some examples, one end of the first chip-on-film 120 is coupled to the first end of the flexible printed circuit 110, and another end (e.g., an opposite end) of the first chip-on-film 120 is coupled to the display panel 300. One end of the second chip-on-film 130 is coupled to the first end of the flexible printed circuit 110, and another end (e.g., an opposite end) of the second chip-on-film 130 is coupled to the display panel 300. Another end (referred to as a second end hereinafter) of the flexible printed circuit 110 is coupled to the circuit board 200. For example, the second end, opposite to the first end, of the flexible printed circuit 110 is coupled to the circuit board 200.

In some examples, the first chip-on-film 120 is bonded to the first end of the flexible printed circuit 110, and the second chip-on-film 130 is also bonded to the first end of the flexible printed circuit 110. Signals may be transmitted between the flexible printed circuit 110 and the display panel 300 through the first chip-on-film 120 and the second chip-on-film 130.

As shown in FIG. 3, the flexible printed circuit 110 has a first surface M1 and a second surface M2 that are opposite in a thickness direction (i.e., a third direction Z) of the flexible printed circuit 110. The first chip-on-film 120 is coupled to the first surface M1, and the second chip-on-film 130 is coupled to the second surface M2. That is, the first chip-on-film 120 is partially located on the first surface M1, and the second chip-on-film 130 is partially located on the second surface M2.

For example, the first surface M1 of the flexible printed circuit 110 has a bonding region at the first end, and the second surface M2 of the flexible printed circuit 110 has another bonding region at the first end. That is, the flexible printed circuit 110 has two bonding regions at the first end. The first chip-on-film 120 and the second chip-on-film 130 are bonded to the flexible printed circuit 110 in the two bonding regions, respectively, so that the flexible printed circuit 110 may realize a double-sided bonding.

In a case where all the chip-on-films (e.g., the first chip-on-film and the second chip-on-film) are coupled to a same surface of the flexible printed circuit at a same end of the flexible printed circuit, two adjacent chip-on-films are spaced apart. That is, there may be a certain distance between the two adjacent chip-on-films. As a result, a width of the flexible printed circuit is relatively large. Thus, the flexible printed circuit occupies a large space in the display device, so that the display device may not achieve compact layout, lightness and thinness. Moreover, in a case where the width of the flexible printed circuit is too large, elements (e.g., including pins, etc.) in the flexible printed circuit have a high probability of deformation in a manufacturing process, so that it is difficulty for the elements to satisfy an amount of deformation of the design specification. As a result, a yield of bonding performed on the flexible printed circuit (e.g., bonding the display panel to the flexible printed circuit) is lowered.

However, in the connection structure provided in the embodiments of the present disclosure, the first chip-on-film 120 and the second chip-on-film 130 are respectively coupled to two surfaces of the flexible printed circuit 110, so that the flexible printed circuit 110 may realize the double-sided bonding. In this way, an orthogonal projection of the first chip-on-film 120 on a plane perpendicular to the thickness direction of the flexible printed circuit 110 and an orthogonal projection of the second chip-on-film 130 on the plane may have a smaller distance therebetween or overlap with each other, thereby reducing a width of the flexible printed circuit 110, reducing a space occupied by the flexible printed circuit 110 in the display device 400, and facilitating realization of the compact layout, lightness and thinness of the display device 400. Moreover, the saved space may be used to arrange other components, which is conducive to improving the performance of the display device. For example, the saved space may be used to increase the battery capacity to increase endurance time of the display device 400. In addition, in a manufacturing process of the flexible printed circuit 110, a deformation rate of the elements in the flexible printed circuit 110 may be lowered due to a reduction in the width of the flexible printed circuit 110, thereby improving the yield of bonding performed on the flexible printed circuit 110, and improving the performance of the flexible printed circuit 110.

Furthermore, in the embodiments of the present disclosure, as for a display device with high resolution or large size, in which there are a relatively large number of signal lines, a size of the flexible printed circuit 110 in the connection structure 100 may not increase (for example, the width of the flexible printed circuit 110 may not increase). In this way, it is beneficial to improve the performance of the display device.

In some embodiments, as shown in FIGS. 2 to 7, and 11, an orthogonal projection of the first chip-on-film 120 on a plane perpendicular to the thickness direction of the flexible printed circuit 110 partially overlaps with an orthogonal projection of the second chip-on-film 130 on the plane.

Figure 4:
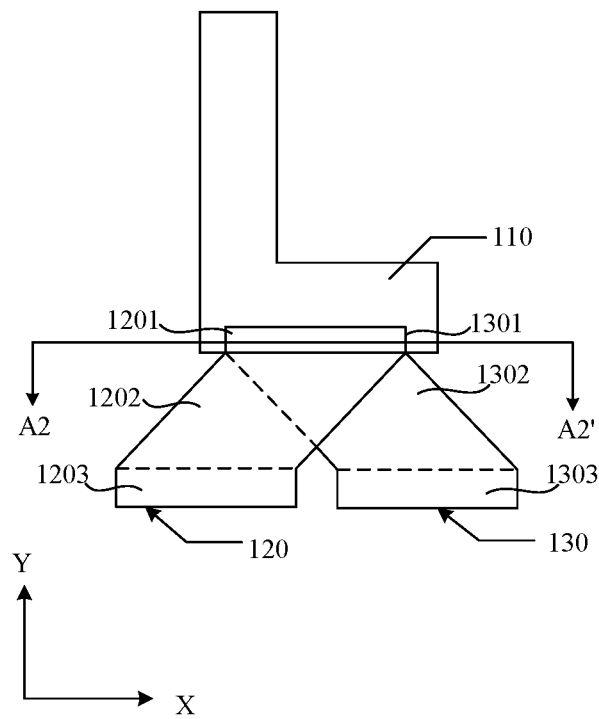
FIG. 4 is a structural diagram of another connection structure, in accordance with some embodiments.
Figure 11:
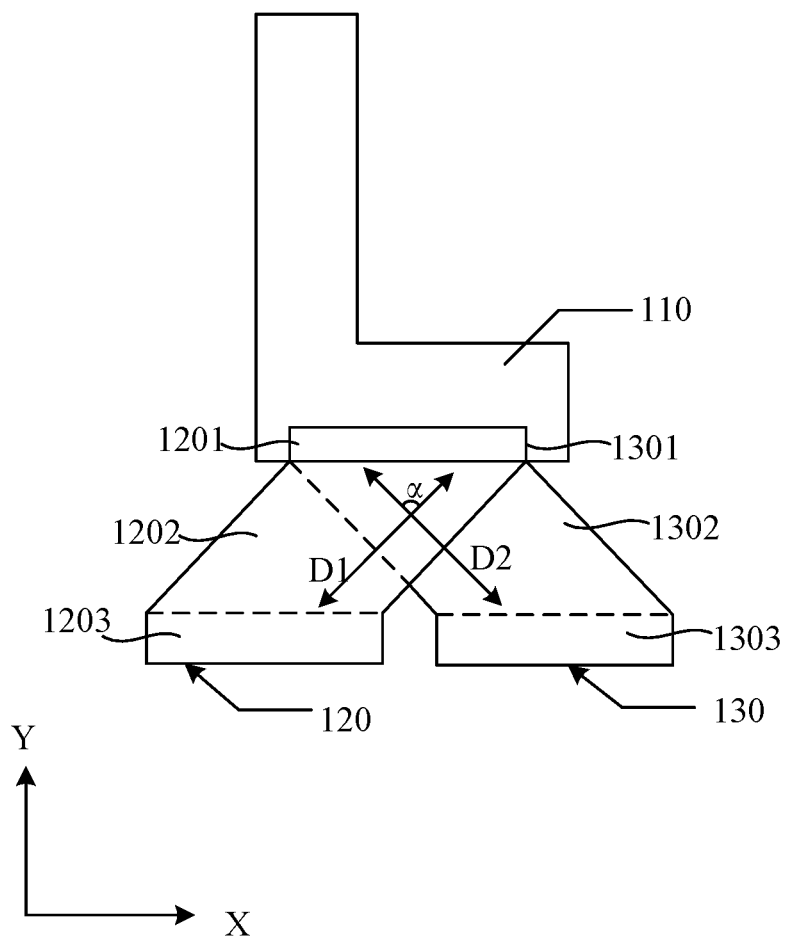
FIG. 11 is a structural diagram of yet another connection structure, in accordance with some embodiments.

In some examples, as shown in FIGS. 2, 4, and 11, the first chip-on-film 120 includes a first portion 1201 disposed on and in direct contact with the flexible printed circuit 110, the second chip-on-film 130 includes a second portion 1301 disposed on and in direct contact with the flexible printed circuit 110, and an orthogonal projection of the first portion 1201 on the plane and an orthogonal projection of the second portion 1301 on the plane at least partially overlap.

For example, as shown in FIGS. 2 and 3, the first portion 1201 of the first chip-on-film 120 is bonded to the first end of the flexible printed circuit 110, the second portion 1301 of the second chip-on-film 130 is bonded to the first end of the flexible printed circuit 110, and the orthogonal projection of the first portion 1201 on the plane partially overlaps with the orthogonal projection of the second portion 1301 on the plane.

In this way, there is an overlapping region between the orthogonal projection of the first portion 1201 on the plane and the orthogonal projection of the second portion 1301 on the plane, so that a width of a portion (i.e., the first end) used for bonding of the flexible printed circuit 110 may be reduced. As a result, the width of the flexible printed circuit 110 may be reduced.

Figure 5:
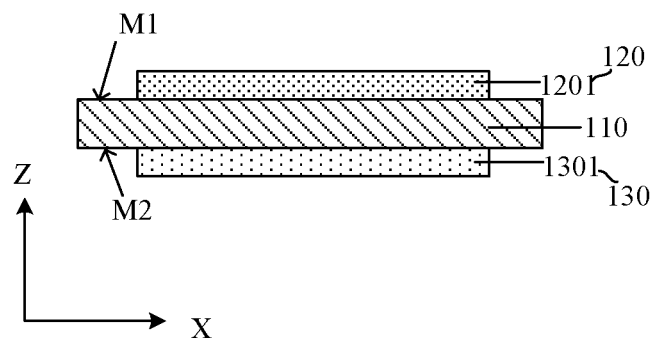
FIG. 5 is a sectional view of the connection structure shown in FIG. 4 taken along the A2-A2' line.

For another example, as shown in FIGS. 4 and 5, the orthogonal projection of the first portion 1201 on the plane completely overlaps with or approximately completely overlaps with the orthogonal projection of the second portion 1301 on the plane. In this way, the orthogonal projection of the first portion 1201 on the plane and the orthogonal projection of the second portion 1301 on the plane are located in a same region, so that a total area of the portion used for bonding of the flexible printed circuit 110 may be reduced. As a result, the width of the flexible printed circuit 110 may be effectively reduced.

In some examples, as shown in FIGS. 2, 4, and 11, the first chip-on-film 120 further includes a third portion 1202 and a fourth portion 1203 (that is, the first chip-on film 120 may be divided into three portions), the third portion 1202 is located between the first portion 1201 and the fourth portion 1203, and the fourth portion 1203 is configured to be coupled with the display panel 300. The second chip-on-film 130 further includes a fifth portion 1302 and a sixth portion 1303 (that is, the second chip-on film 130 may be divided into three portions), the fifth portion 1302 is located between the second portion 1301 and the sixth portion 1303, and the sixth portion 1303 is configured to be coupled with the display panel 300. An orthogonal projection of the third portion 1202 on the plane and an orthogonal projection of the fifth portion 1302 on the plane at least partially overlap.

For example, an orthogonal projection of the third portion 1202 on the plane and an orthogonal projection of the fifth portion 1302 on the plane partially overlap. For example, referring to FIG. 11, the third portion 1202 is gradually inclined to the left from right, and the fifth portion 1302 is gradually inclined to the right from left.

In some examples, a side of an orthogonal projection of the fourth portion 1203 on the plane and an adjacent side of an orthogonal projection of the sixth portion 1303 on the plane have a distance therebetween.

The third portion 1202 and the fifth portion 1302 are inclined in different directions, and the side of the orthogonal projection of the fourth portion 1203 on the plane and the adjacent side of the orthogonal projection of the sixth portion 1303 on the plane have a distance therebetween, so that the fourth portion 1203 and the sixth portion 1303 are respectively bonded to different portions of the display panel 300 that are arranged in the width direction (e.g., the first direction X in FIG. 11) of the flexible printed circuit 110, and the third portion 1202 and the fifth portion 1302 each have a non-overlapping portion. That is, an orthogonal projection of the non-overlapping portion of the third portion 1202 on the plane does not overlap with an orthogonal projection of the non-overlapping portion of the fifth portion 1302 on the plane.

In a case where the first chip-on-film 120 and the second chip-on-film 130 are bonded to the flexible printed circuit 110 in the double-sided bonding manner, and the orthogonal projection of the first portion 1201 on the plane at least partially overlaps with the orthogonal projection of the second portion 1301 on the plane and the orthogonal projection of the third portion 1202 on the plane partially overlaps with the orthogonal projection of the fifth portion 1302 on the plane, the fourth portion 1203 and the sixth portion 1303 may form a structure in which the two are located in a same layer but do not overlap with each other. That is, the first chip-on-film 120 and the second chip-on-film 130 may be bonded to a same surface of the display panel 300, but may not overlap with each other, thereby facilitating realization of a single-sided bonding with the display panel 300, and simplifying the bonding process.

For example, referring to FIG. 11, an included angle α between a direction D1 in which the third portion 1202 is inclined and a direction D2 in which the fifth portion 1302 is inclined is greater than 0° and less than or equal to 90°. For example, the included angle between the direction D1 of the third portion 1202 and the direction D2 of the fifth portion 1302 may be 30°, 45°, 60°, or 75°.

In some examples, as shown in FIGS. 2, 4, and 11, the third portion 1202 is in a shape of a parallelogram or an approximate parallelogram. For example, an angle between two connected sides of the parallelogram is an acute angle (i.e., the angle is greater than 0° and less than 90°) or an obtuse angle (i.e., the angle is greater than 90° and less than 180°).

In some examples, as shown in FIGS. 2, 4, and 11, the fifth portion 1302 is in a shape of a parallelogram or an approximate parallelogram. For example, an angle between two connected sides of the parallelogram is an acute angle (i.e., the angle is greater than 0° and less than 90°) or an obtuse angle (i.e., the angle is greater than 90° and less than 180°).

In some examples, as shown in FIGS. 2, 4, and 11, shapes of the first portion 1201 and the second portion 1301 are both rectangular. In some examples, as shown in FIGS. 2, 4 and 11, shapes of the fourth portion 1203 and the sixth portion 1303 are both rectangular. In this way, it is beneficial to realize the bonding of the first chip-on-film 120 and the second chip-on-film 130 to the flexible printed circuit 110 and the display panel 300.

In some embodiments, referring to FIGS. 6 to 9, the first chip-on-film 120 includes a first flexible substrate 121 and at least one first chip 122 disposed on the first flexible substrate 121. The second chip-on-film 130 includes a second flexible substrate 131 and at least one second chip 132 disposed on the second flexible substrate 131. An orthogonal projection of the at least one first chip 122 on a plane (e.g., referring to a plane formed by the first direction X and the second direction Y) perpendicular to the thickness direction (e.g., the third direction Z) of the flexible printed circuit 110 does not overlap with an orthogonal projection of the at least one second chip 132 on the plane. That is, the orthogonal projection of the first chip 122 on the plane and the orthogonal projection of the second chip 132 are spaced apart.

Figure 6:
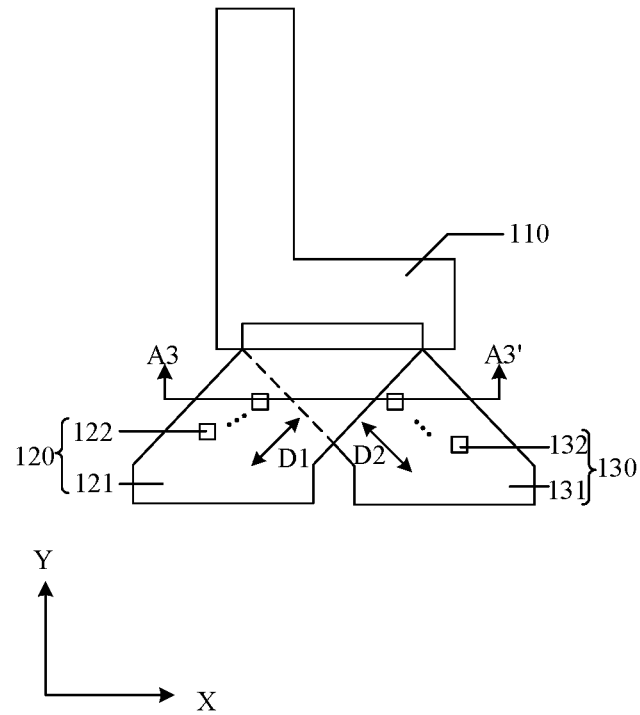
FIG. 6 is a structural diagram of yet another connection structure, in accordance with some embodiments.
Figure 7:
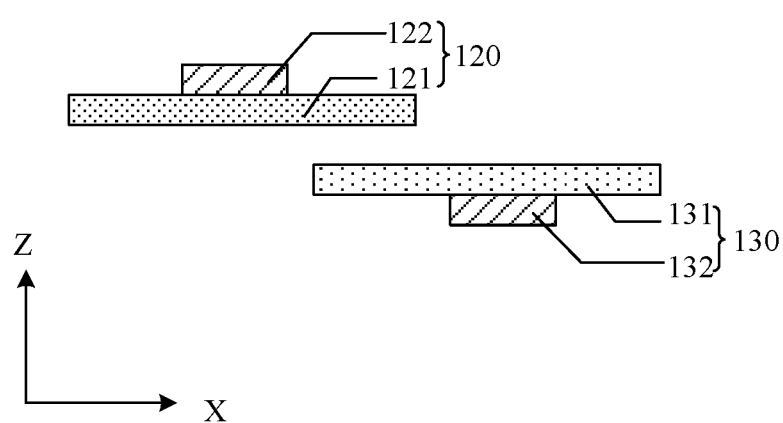
FIG. 7 is a sectional view of the connection structure shown in FIG. 6 taken along the A3-A3' line.

For example, as shown in FIGS. 4 and 6, the first chip 122 and the second chip 132 may be respectively located in the non-overlapping portions of the third portion 1202 and the fifth portion 1302, so that the first chip 122 and the second chip 132 do not overlap with each other.

In this way, signal interference between the first chip 122 and the second chip 132 may be avoided, the transmission effect of signals may be improved, and thus the accuracy of signal transmission may be ensured.

In addition, since the third portion 1202 or the fifth portion 1302 is of a structure of a parallelogram, which may provide a relatively regular bearing surface for the chip(s), so as to facilitate the arrangement of the chip(s) and the wiring.

In some examples, each of the first chip 122 and the second chip 132 is an integrated circuit (IC) such as a source IC.

Figure 10A:
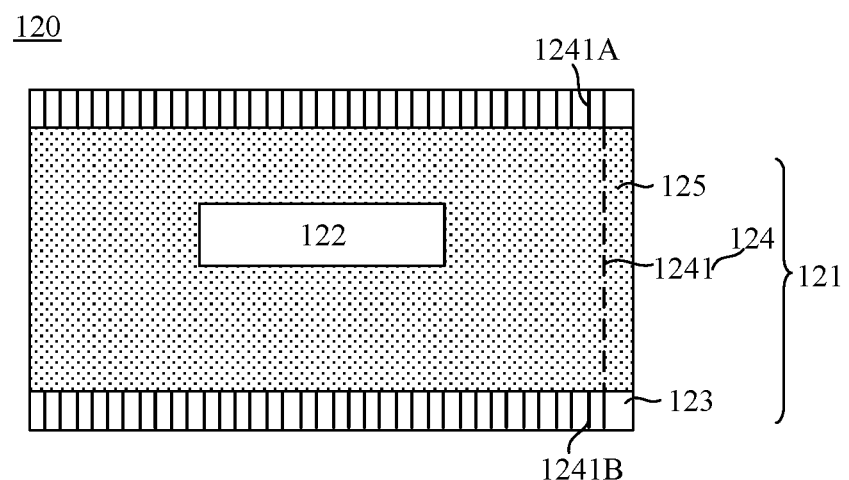
FIG. 10A is a schematic top view of a first chip-on-film, in accordance with some embodiments.
Figure 10B:
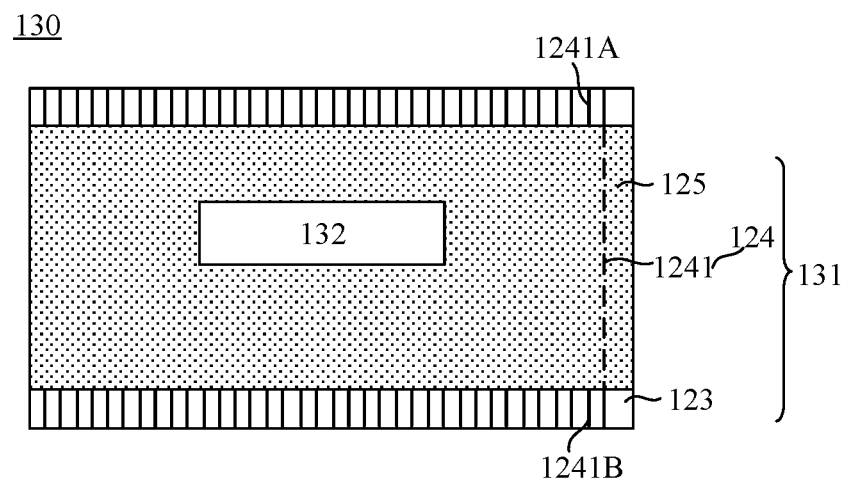
FIG. 10B is a schematic top view of a second chip-on-film, in accordance with some embodiments.

In some examples, as shown in FIGS. 10A and 10B, the first flexible substrate 121 and the second flexible substrate 131 both include a flexible base 123, a wiring layer 124 disposed on the flexible base 123, and an insulating layer 125 disposed on a side of the wiring layer 124 away from the flexible base 123. The wiring layer 124 includes a plurality of traces 1241, and two ends of each trace 1241 are a first pin 1241A and a second pin 1241B. The first pin 1241A and the second pin 1241B are configured to be bonded to the flexible printed circuit 110 and the display panel 300, respectively. In the first chip-on-film 120, an orthogonal projection of the insulating layer 125 on the flexible base 123 does not overlap with orthogonal projections of the first pins 1241A, the second pins 1241B and the first chip(s) 122 on the flexible base 123. In the second chip-on-film 130, an orthogonal projection of the insulating layer 125 on the flexible base 123 does not overlap with orthogonal projections of the first pins 1241A, the second pins 1241B and the second chip(s) 132 on the flexible base 123.

For example, the wiring layer 124 is made of silver or copper. For example, the insulating layer 125 is made of green oil (i.e., a liquid photo solder resist). For example, the flexible base 123 is made of polyimide (PI), polyamide (PA), poly(p-phenylene benzobisoxazole) (PBO), or the like.

In some examples, the at least one first chip 122 includes a plurality of first chips 122, and the at least one second chip 132 includes a plurality of second chips 132. For example, the plurality of first chips 122 are uniformly distributed, and the plurality of second chips 132 are uniformly distributed.

As shown in FIGS. 4 and 6, the direction D1 in which the third portion 1202 is inclined and the direction D2 in which the fifth portion 1302 is inclined are not parallel, and if the at least one first chip 122 includes the plurality of first chips 122, and the at least one second chip 132 includes the plurality of second chips 132, the first chips 122 may be arranged in the direction D1, and/or the second chips 132 may be arranged the direction D2.

It will be noted that those skilled in the art may design an arrangement of the first chips 122 on the first flexible substrate 121 and an arrangement of the second chips 132 on the second flexible substrate 131 according to practical situations, and the specific details are not limited herein.

For example, as shown in FIG. 6, an arrangement of the first chips 122 in the first chip-on-film 120 may be such that at least a part of the first chips 122 are spaced apart in a row in the direction D1 in which the third portion 1202 is inclined. An arrangement of the second chips 132 in the second chip-on-film 130 may be such that at least a part of the second chips 132 are spaced apart in a row in the direction D2 in which the fifth portion 1302 is inclined.

Figure 8:
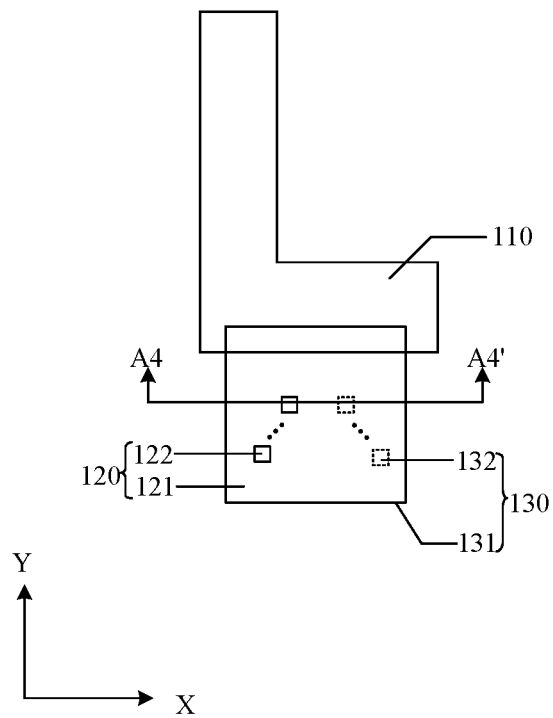
FIG. 8 is a structural diagram of yet another connection structure, in accordance with some embodiments.
Figure 9:
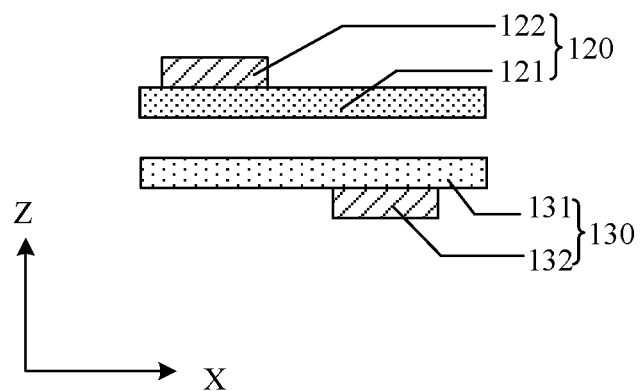
FIG. 9 is a sectional view of the connection structure shown in FIG. 8 taken along the A4-A4' line.

In some embodiments, as shown in FIGS. 8 and 9, the orthogonal projection of the first chip-on-film 120 on the plane completely overlaps with the orthogonal projection of the second chip-on-film 130 on the plane. In this case, in a case where the first chip-on-film 120 and the second chip-on-film 130 are bonded to the flexible printed circuit 110 in the double-sided bonding manner, the first chip-on-film 120 and the second chip-on-film 130 may be bonded to two opposite surfaces of the display panel 300 in a thickness direction of the display panel 300.

In some examples, in the case where the at least one first chip 122 includes the plurality of first chips 122, and the at least one second chip 132 includes the plurality of second chips 132, as shown in FIG. 8, a direction in which the first chips 122 are arranged and a direction in which the second chips 132 are arranged are different.

Figure 12:
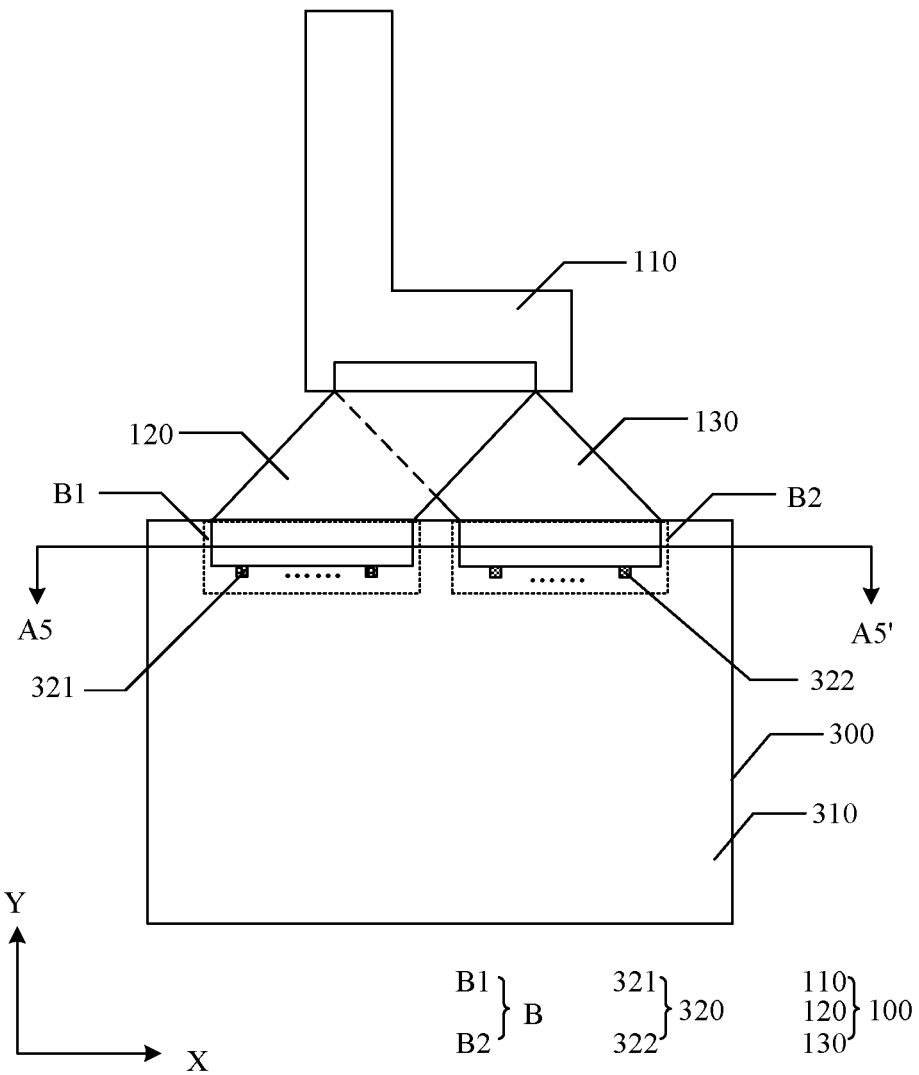
FIG. 12 is a structural diagram of another display device, in accordance with some embodiments.
Figure 13:
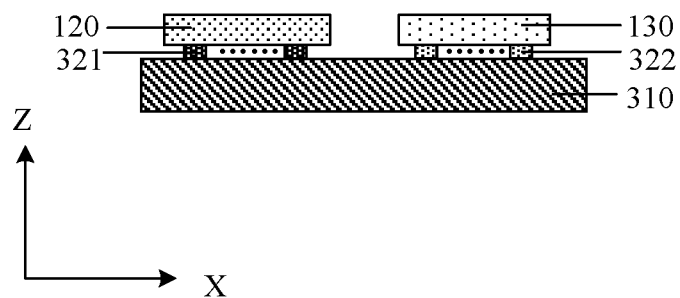
FIG. 13 is a sectional view of the display device shown in FIG. 12 taken along the A5-A5' line.

In some embodiments, as shown in FIGS. 12 and 13, the display panel 300 includes a base substrate 310 and a plurality of bonding elements 320 disposed on the base substrate 310. The first chip-on-film 120 and the second chip-on-film 130 of the connection structure 100 are bonded to the plurality of bonding elements 320 of the display panel 300. In a case where the first chip-on-film 120 includes the first portion 1201, the third portion 1202 and the fourth portion 1203, and the second chip-on-film 130 includes the second portion 1301, the fifth portion 1302 and the sixth portion 1303, the fourth portion 1203 of the first chip-on-film 120 and the sixth portion 1303 of the second chip-on-film 130 are bonded to the plurality of bonding elements 320 of the display panel 300. For example, the plurality of bonding elements 320 are located in the bonding region B.

For example, the bonding elements 320 include pads, pins, or gold fingers, which are used for realizing bonding between the first chip-on-film 120 and the display panel 300, and bonding between the second chip-on-film 130 and the display panel 300. For example, the base substrate 310 may be a rigid substrate (or referred to as a hard substrate) such as a glass substrate, or a flexible substrate such as a PI substrate. The display panel 300 may further include display function layers used for forming the plurality of sub-pixels P.

In some embodiments, referring to FIG. 12, the plurality of bonding elements 320 include a plurality of first bonding elements 321 and a plurality of second bonding elements 322. The bonding region B includes a first bonding sub-region B1 and a second bonding sub-region B2. The plurality of first bonding elements 321 are located in the first bonding sub-region B1, and the plurality of second bonding elements 322 are located in the second bonding sub-region B2. The plurality of first bonding elements 321 are configured to be bonded with the first chip-on-film 120. The plurality of second bonding elements 322 are configured to be bonded with the second chip-on-film 130. For example, the fourth portion 1203 of the first chip-on-film 120 is bonded to the plurality of first bonding elements 321 in the first bonding sub-region B1. The sixth portion 1303 of the second chip-on-film 130 is bonded to the plurality of second bonding elements 322 in the second bonding sub-region B2.

In some examples, in a thickness direction of the base substrate 310 (e.g., referring to the third direction Z in FIG. 13), the plurality of first bonding elements 321 and the plurality of second bonding elements 322 are located on a same surface of the base substrate 310, and two adjacent side faces of two adjacent bonding elements among the plurality of first bonding elements 321 and the plurality of second bonding elements 322 have a distance therebetween. In this case, the first chip-on-film 120 and the second chip-on-film 130 are bonded to the same surface of the display panel 300. That is, the display panel 300 realizes a single-sided bonding, which may be suitable for a display panel with a large size or large layout space.

Figure 14:
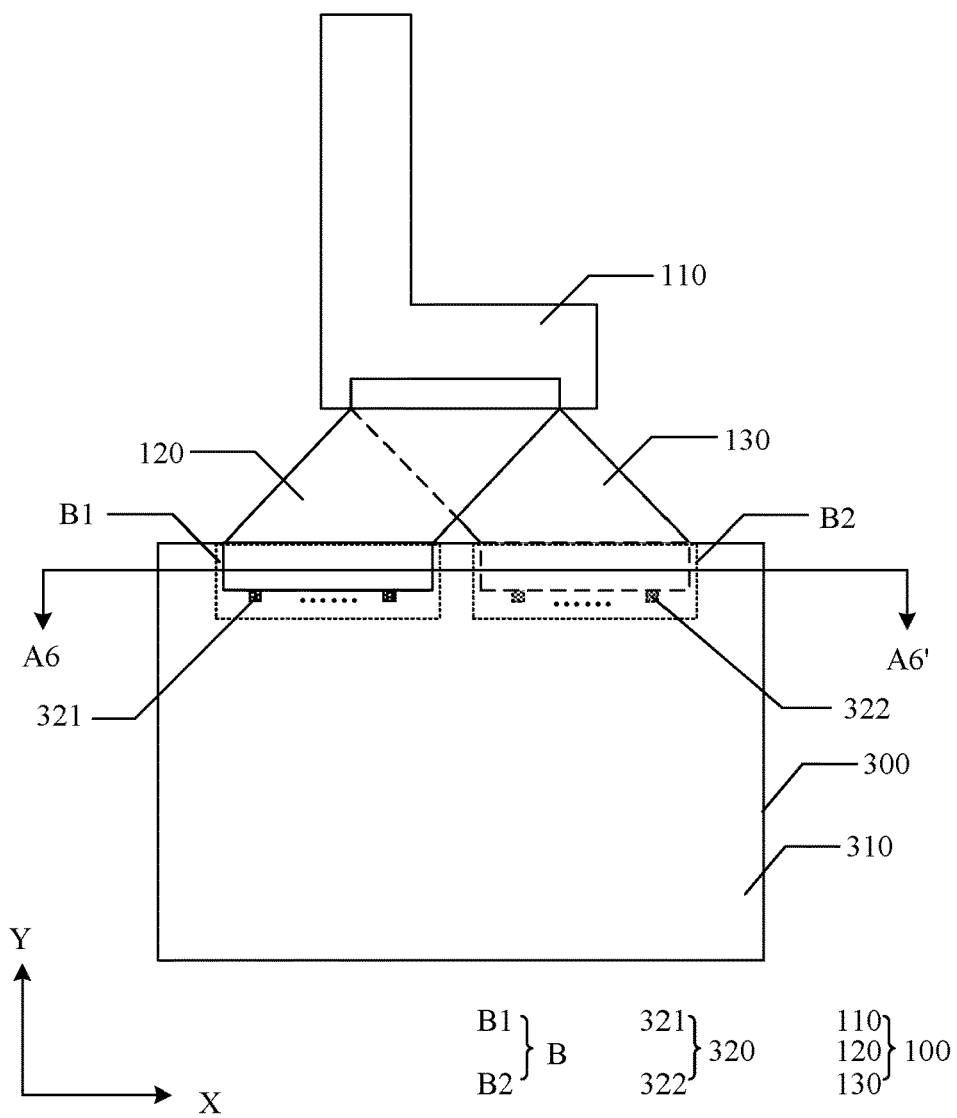
FIG. 14 is a structural diagram of yet another display device, in accordance with some embodiments.
Figure 15:
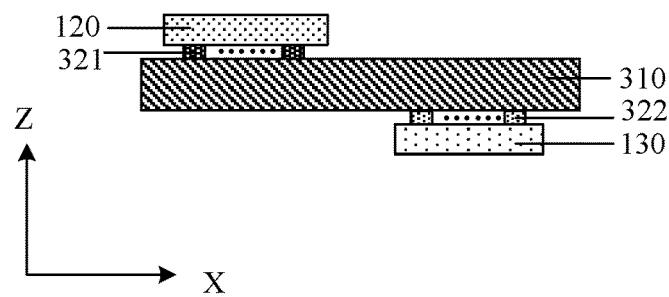
FIG. 15 is a sectional view of the display device shown in FIG. 14 taken along the A6-A6' line.

In some other examples, referring to FIGS. 14 and 15, the plurality of first bonding elements 321 and the plurality of second bonding elements 322 are respectively located on two opposite surfaces of the base substrate 310 in the thickness direction of the base substrate 310. In this case, the first chip-on-film 120 and the second chip-on-film 130 are bonded to the two opposite surfaces of the display panel 300 in the thickness direction of the base substrate 310. That is, the display panel 300 realizes a double-sided bonding, which may reduce a space required for bonding the connection structure 100 and the display panel 300, and may be suitable for a display panel with a small size or limited layout space.

Figure 16:
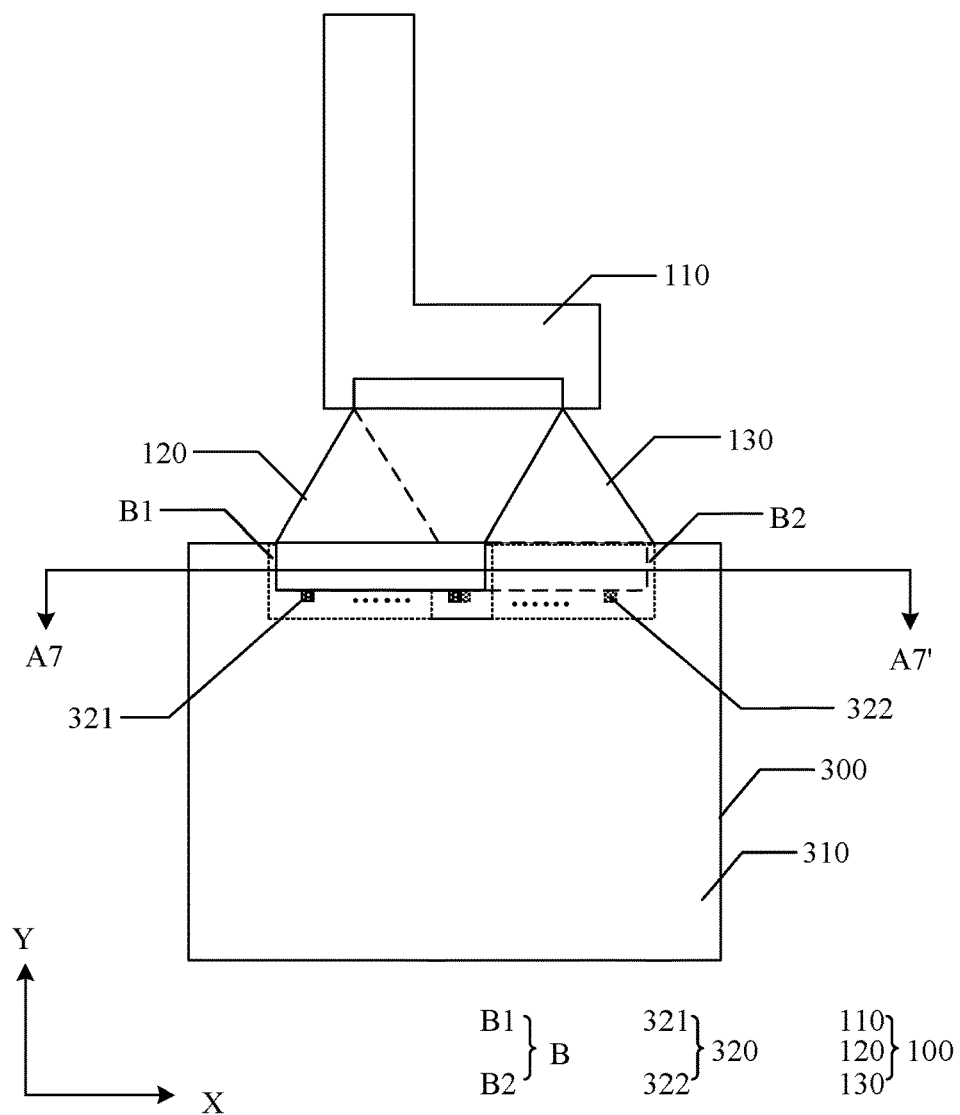
FIG. 16 is a structural diagram of yet another display device, in accordance with some embodiments.
Figure 17:
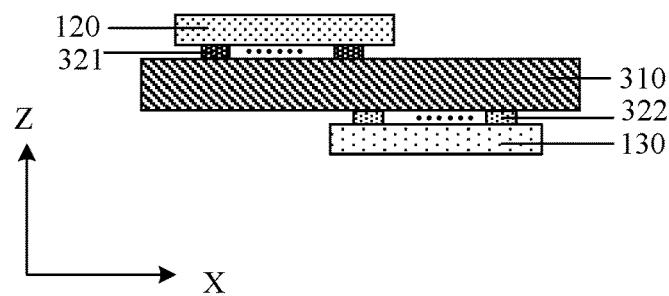
FIG. 17 is a sectional view of the display device shown in FIG. 16 taken along the A7-A7' line.

For example, as shown in FIGS. 16 and 17, orthogonal projections of the plurality of first bonding elements 321 on a plane perpendicular to the thickness direction of the base substrate 310 overlap with orthogonal projections of the plurality of second bonding elements 322 on the plane. In this case, the first sub-bonding region B1 overlaps with the second sub-bonding region B2, which may reduce a total area of the bonding region B. It can be understood that the plurality of first bonding elements 321 and the plurality of second bonding elements 322 are insulated from each other.

For another example, as shown in FIGS. 14 and 15, the orthogonal projections of the plurality of first bonding elements 321 on the plane perpendicular to the thickness direction of the base substrate 310 do not overlap with the orthogonal projections of the plurality of second bonding elements 322 on the plane. In this case, each of the orthogonal projections of the plurality of first bonding elements 321 on the base substrate 310 and each of the orthogonal projections of the plurality of second bonding elements 322 on the base substrate 310 have a distance therebetween. That is, there is a certain distance between the first sub-bonding region B1 and the second sub-bonding region B2 in the width direction (e.g., the first direction X in FIG. 14) of the flexible printed circuit 110.

It will be noted that the above-mentioned display device 400 have same beneficial effects as the above-mentioned connection structure 100, which will not be repeated herein.

The foregoing descriptions are merely some specific implementation manners of the present disclosure, but the protection scope of the present disclosure is not limited thereto, and changes or replacements that any person skilled in the art could conceive of within the technical scope disclosed by the present disclosure should be within the protection scope of the present disclosure. Therefore, the protection scope of the present disclosure shall be subject to the protection scope of the claims.

What is claimed is:

1. A connection structure configured to connect a display panel and a circuit board, the connection structure comprising:
   a flexible printed circuit; and
   a first chip-on-film and a second chip-on-film that are coupled to one end of the flexible printed circuit, wherein
   the first chip-on-film and the second chip-on-film are coupled to two surfaces of the flexible printed circuit that are opposite in a thickness direction of the flexible printed circuit;
   wherein the first chip-on-film includes a first portion disposed on and in direct contact with the flexible printed circuit, the second chip-on-film includes a second portion disposed on and in direct contact with the flexible printed circuit and an orthogonal projection of the first portion on a plane perpendicular to the thickness direction of the flexible printed circuit and an orthogonal projection of the second portion on the plane at least partially overlap.

2. The connection structure according to claim 1, wherein the orthogonal projection of the first portion on the plane approximately completely overlaps with the orthogonal projection of the second portion on the plane.

3. The connection structure according to claim 1, wherein shapes of the first portion and the second portion are both rectangular.

4. The connection structure according to claim 1, wherein the first chip-on-film further includes a third portion and a fourth portion, the third portion is located between the first portion and the fourth portion, and the fourth portion is configured to be coupled with the display panel;

the second chip-on-film includes a fifth portion and a sixth portion, the fifth portion is located between the second portion and the sixth portion, and the sixth portion is configured to be coupled with the display panel; and an orthogonal projection of the third portion on the plane and an orthogonal projection of the fifth portion on the plane at least partially overlap.

5. The connection structure according to claim 4, wherein an included angle between a direction in which the third portion is inclined and a direction in which the fifth portion is inclined is greater than 0° and less than or equal to 90°.

6. The connection structure according to claim 4, wherein the third portion is in a shape of an approximate parallelogram; and/or the fifth portion is in a shape of an approximate parallelogram.

7. The connection structure according to claim 4, wherein a side of an orthogonal projection of the fourth portion on the plane and an adjacent side of an orthogonal projection of the sixth portion on the plane have a distance therebetween.

8. The connection structure according to claim 4, wherein shapes of the fourth portion and the sixth portion are both rectangular.

9. The connection structure according to claim 1, wherein the first chip-on-film includes a first flexible substrate and at least one first chip disposed on the first flexible substrate; the second chip-on-film includes a second flexible substrate and at least one second chip disposed on the second flexible substrate; and an orthogonal projection of the at least one first chip on a plane perpendicular to the thickness direction of the flexible printed circuit is non-overlapping with an orthogonal projection of the at least one second chip on the plane.

10. The connection structure according to claim 9, wherein the first flexible substrate and the second flexible substrate both include a flexible base, a wiring layer disposed on the flexible base, and an insulating layer disposed on a side of the wiring layer away from the flexible base;

the wiring layer includes a plurality of traces, and two ends of each trace are a first pin and a second pin; the first pin and the second pin are configured to be bonded to the flexible printed circuit and the display panel, respectively.

11. The connection structure according to claim 10, wherein in the first chip-on-film, an orthogonal projection of the insulating layer on the flexible base is non-overlapping with orthogonal projections of first pins and second pins of the plurality of traces and the at least one first chip on the flexible base;

in the second chip-on-film, an orthogonal projection of the insulating layer on the flexible base is non-overlapping with orthogonal projections of first pins and second pins of the plurality of traces and the at least one second chip on the flexible base.

12. The connection structure according to claim 10, wherein the wiring layer is made of silver or copper; and/or the insulating layer is made of green oil.

13. A display device, comprising:

a display panel including a base substrate and a plurality of bonding elements disposed on the base substrate; and the connection structure according to claim 1, wherein the first chip-on-film and the second chip-on-film of the connection structure are bonded to the plurality of bonding elements.

14. The display device according to claim 13, wherein the first chip-on-film includes a first portion disposed on and in direct contact with the flexible printed circuit, the second chip-on-film includes a second portion disposed on and in direct contact with the flexible printed circuit;

the first chip-on-film further includes a third portion and a fourth portion, the third portion is located between the first portion and the fourth portion; the second chip-on-film further includes a fifth portion and a sixth portion, the fifth portion is located between the second portion and the sixth portion; and the fourth portion and the sixth portion are bonded to the plurality of bonding elements.

15. The display device according to claim 13, wherein the plurality of bonding elements include a plurality of first bonding elements and a plurality of second bonding elements;

the first chip-on-film is bonded to the plurality of first bonding elements;

the second chip-on-film is bonded to the plurality of second bonding elements; and the plurality of first bonding elements and the plurality of second bonding elements are located on a same surface of the base substrate, and two adjacent side faces of two adjacent bonding elements among the plurality of first bonding elements and the plurality of second bonding elements have a distance therebetween.

16. The display device according to claim 13, wherein the plurality of bonding elements include a plurality of first bonding elements and a plurality of second bonding elements;

the first chip-on-film is bonded to the plurality of first bonding elements;

the second chip-on-film is bonded to the plurality of second bonding elements; and the plurality of first bonding elements and the plurality of second bonding elements are respectively located on opposite surfaces of the base substrate in a thickness direction of the base substrate.

17. The display device according to claim 16, wherein orthogonal projections of the plurality of first bonding elements on a plane perpendicular to the thickness direction of the base substrate overlap with orthogonal projections of the plurality of second bonding elements on the plane.

18. The display device according to claim 16, wherein orthogonal projections of the plurality of first bonding elements on a plane perpendicular to the thickness direction of the base substrate are non-overlapping with orthogonal projections of the plurality of second bonding elements on the plane.

19. The display device according to claim 13, further comprising a circuit board bonded to another end of the flexible printed circuit of the connection structure.

\* \* \* \* \*